(12) United States Patent
Nonaka

(10) Patent No.: US 8,269,547 B2
(45) Date of Patent: Sep. 18, 2012

(54) BOOTSTRAP CIRCUIT

(75) Inventor: Yoshihiro Nonaka, Kanagawa (JP)

(73) Assignee: NLT Technologies, Ltd., Kanagawa (JP)

( * ) Notice: Subject to any disclaimer, the term of this patent is extended or adjusted under 35 U.S.C. 154(b) by 210 days.

(21) Appl. No.: 12/873,719

(22) Filed: Sep. 1, 2010

(65) Prior Publication Data

US 2011/0050317 A1 Mar. 3, 2011

(30) Foreign Application Priority Data

Sep. 1, 2009 (JP) ................................. 2009-202060

(51) Int. Cl.
*H03K 17/16* (2006.01)
(52) U.S. Cl. ........................................ 327/390; 327/589
(58) Field of Classification Search .................. 327/390, 327/589
See application file for complete search history.

(56) References Cited

U.S. PATENT DOCUMENTS

| 5,512,845 A * | 4/1996 | Yuh ................................. 326/88 |
| 5,929,686 A * | 7/1999 | Itou .............................. 327/321 |

FOREIGN PATENT DOCUMENTS

| JP | 1-94591 A | 4/1989 |
| JP | 11-39865 A | 2/1999 |
| JP | 2004-64528 A | 2/2004 |

* cited by examiner

*Primary Examiner* — Kenneth B. Wells
(74) *Attorney, Agent, or Firm* — Sughrue Mion, PLLC

(57) ABSTRACT

A bootstrap circuit comprises: a first transistor connecting a first power supply with an output node; and a second transistor applying a first input signal to a gate node of the first transistor and having a conductivity type identical to that of the first transistor. A second input signal obtained by inverting a level of the first input signal, delaying the inverted signal, and adding a direct current bias to the delayed signal is inputted to a gate node of the second transistor.

14 Claims, 22 Drawing Sheets

$C_2$: MOS CAPACITOR

BOOTSTRAP CIRCUIT

TECHNICAL FIELD

Reference to Related Application

This application is based upon and claims the benefit of the priority of Japanese patent application No. 2009-202060, filed on Sep. 1, 2009, the disclosure of which is incorporated herein in its entirety by reference thereto.
The present invention relates to a bootstrap circuit, and in particular, it relates to a bootstrap circuit suitably applicable to a level shift circuit and a memory device word line driving circuit that increase an amplitude of an input signal.

BACKGROUND

Complementary metal oxide semiconductor (CMOS) circuits are formed by N-type and P-type MOS transistors and generally dissipate less power. Thus, CMOS circuits are often used to form semiconductor devices. When a power supply having a high potential VDD and a low potential VSS is used, a CMOS circuit can output a binary pulse signal exhibiting the high and low potentials VDD and VSS. Namely, a CMOS circuit can be configured so that P- and N-type MOS transistors output high and low potentials, respectively, when these transistors are brought in a conductive state. However, since P- and N-type MOS transistors need to be formed to manufacture a CMOS device, an impurity implantation process needs to be carried out a plurality of times, in addition to processes such as for film formation, mask exposure, and etching. Thus, manufacturing costs are increased.

In contrast, to manufacture a semiconductor device formed only by MOS transistors of a single conductivity type (either P- or N-type MOS transistors), a smaller number of impurity implantation processes and the like is required. Thus, for this type of semiconductor devices, manufacturing costs are less than those of CMOS devices. However, because of a single conductive property, these semiconductor devices dissipate more power and have a narrower output margin, compared with CMOS devices. For example, if a circuit is formed only by P-type MOS transistors, when outputting a low voltage, the circuit outputs a voltage higher than the low potential VSS by a threshold voltage of the transistors. If a circuit is formed only by N-type MOS transistors, when outputting a high voltage, the circuit outputs a voltage lower than the high potential VDD by a threshold voltage of the transistors.

In order to obtain an increase in amplitude, dynamic circuits using a bootstrap effect have been proposed and used. FIG. 18 illustrates an example of a conventional bootstrap circuit based on Patent Document 1. This bootstrap circuit includes: an N-type MOS transistor 101 connecting a power supply VDD and an output terminal Out; an N-type MOS transistor 102 inputting an input pulse signal In to a gate electrode (node N1) of the transistor 101; a coupling capacitor 103 connecting a source electrode and the gate electrode of the transistor 101; and an N-type MOS transistor 104 connecting a power supply VSS and the output terminal Out. A gate electrode of the transistor 102 is connected to the power supply VDD, and a gate electrode of the transistor 104 is supplied with an input pulse signal Inb. The input pulse signal In is increased to VDD at a high level and decreased to VSS at a low level, and the input pulse signal Inb is an inverted signal of the input pulse signal In.

FIG. 19 is a timing diagram of an operation of the above bootstrap circuit. First, in a period t2, the pulse signals Inb and In are brought to high and low potentials VDD and VSS, respectively. Since the transistors 102 and 104 are brought in a conductive state, potentials at the node N1 and the output terminal Out are decreased to the low potential VSS. Next, in a period t3, the pulse signal Inb is decreased to the low potential VSS, and the pulse signal In is increased to the high potential VDD. Accordingly, the transistor 104 is brought in a non-conductive state. In addition, the potential at the node N1 begins to increase from the low potential VSS via the transistor 102. When the potential at the node N1 reaches VDD−Vth (Vth is a threshold voltage of the transistor 102), the transistor 102 is brought in a non-conductive state. Thus, the potential at the node N1 does not exceed the potential VDD−Vth. Assuming that the low potential VSS at the output terminal Out is a source voltage and the potential VDD−Vth at the node N1 is a gate voltage, if the gate-source voltage is above a threshold voltage of the transistor 101, the transistor 101 is brought in a conductive state. Namely, the potential at the output terminal Out is increased toward the high potential VDD via the transistor 101, and the potential at the node N1 connected to the coupling capacitor 103 is also increased. Since both the gate and source potentials of the transistor 102 are brought to VDD, the transistor 102 is brought in a non-conductive state. Thus, the transistor 102 does not prevent the increase of the potential at the node N1. As a result, the potential at the node N1 exceeds the high potential VDD, and the potential at the output terminal Out is increased to the high potential VDD. The threshold voltage Vth is defined as a gate-source voltage necessary to cause an effective amount of current flow between a source and a drain ($10^{-7}$ ampere, for example).

Further, Patent Document 2 discloses a method for increasing a potential at a node for which a bootstrap effect is produced to VDD, without being decreased to VDD−Vth. FIG. 20 illustrates a circuit including: transistors 111 and 113 connected to an output terminal Vw; a transistor 112 supplying an input signal S to a gate of the transistor 111; an inverter 115 inverting the signal S; a delay circuit 116 delaying the inverted signal outputted from the inverter 115 and supplying the delayed signal to a gate of the transistor 113 and a drain of a transistor 114, that is, to a node N3; and the transistor 114 connecting a gate of transistor 112 and the node N3. Based on this circuit, in order to increase a potential at a node N2 for which a bootstrap effect is produced to VDD independent of a threshold voltage of the transistor 112, a potential at a node N6 is increased to exceed VDD by another bootstrap effect. FIG. 21 is a timing diagram of an operation of the circuit of FIG. 20.

Furthermore, Patent Document 3 discloses a voltage generation circuit for increasing a potential at a node for which a bootstrap effect is produced to VDD, without being decreased to VDD−Vth. The voltage generation circuit of FIG. 22 corresponds to a circuit connected to the gate of the transistor 102 in FIG. 18. When signals ω0 and ω1 are at a high potential VDD, potentials at nodes N21 and N23 are brought to a low potential VSS and to VDD−Vth, respectively, to charge a capacitor C1. When the potential at the node N21 is inverted to the high potential VDD, the potential at the node N23 is increased to VDD−Vth+VDD−VSS, to bring a transistor T11 in a conductive state and charge an output G close to VDD. Further, when the potential at the node N21 is inverted to the low potential VSS, since a potential at a node N22 is increased toward VDD, the output G is increased above VDD.

Patent Document 1: Japanese Patent Kokai Publication No. JP-P2004-64528A
Patent Document 2: Japanese Patent Kokai Publication No. JP-A-11-39865
Patent Document 3: Japanese Patent Kokai Publication No. JP-A-1-94591

SUMMARY

The entire disclosures of the above Patent Documents are incorporated herein by reference thereto.

Analysis will be hereinafter made based on the present invention.

Hereinafter, operating conditions of the above bootstrap circuit of FIG. 18 will be reviewed, assuming that both the transistors 101 and 102 have a threshold voltage Vth. Before a bootstrap effect is produced in the period t3 of FIG. 19, the potential at the node N1, that is, the potential at the gate of the transistor 101, is VDD−Vth, and the potential at the output terminal Out, that is, the potential at the source of the transistor 101, is VSS. To obtain a bootstrap effect, at least the transistor 101 needs to be brought in a conductive state. Namely, a potential difference between the gate and the source of the transistor 101 needs to be equal to or more than the threshold voltage. That is, a condition (VDD−Vth)−VSS≧Vth needs to be met. In other words, the voltage VDD−VSS, or the amplitude of the input signals In and Inb, needs to be equal to or more than twice the threshold voltage Vth.

Further, in FIG. 20, to increase a potential at the node N6, which is another node for which a bootstrap effect is produced, to exceed VDD, a bootstrap effect needs to be produced for a transistor 114. Consequently, the voltage VDD−VSS needs to be equal to or more than twice the threshold voltage of the transistor. Namely, as illustrated in FIG. 21, when the signal S (node N1) is at the low potential VSS and the node N3 is at the high potential VDD in a period t1, while the voltage at a node N6 is increased by the transistor 114, the voltage does not exceed VDD−Vth. Since the voltages at the source (node N1) and the gate (node N6) of the transistor 112 are VSS and VDD−Vth, respectively, unless the condition VDD−Vth−VSS>Vth is met, the transistor 112 is not brought into a conductive state. Thus, in the next period t2, even if the signal S is increased to the high potential VDD, no bootstrap effect is produced for the node N6 and the voltage is not increased. Therefore, the operating condition of the circuit of FIG. 20 is equivalent to that of the circuit disclosed in Patent Document 1. The circuit operating margin with respect to the threshold voltage is not improved.

In contrast, based on the circuit of FIG. 22, the output G is brought to at least VDD+Vth. Thus, since the potential charged by the transistor is at least Vth, at least 2Vth is needed as the potential at the gate of the transistor 102. Since the increased potential at the node N23 is 2VDD−Vth, the circuit operating condition is 2VDD−Vth>2Vth. Namely, the circuit operating margin with respect to the threshold voltage is improved to VDD>1.5Vth.

As described above, these conventional circuits using a bootstrap effect undergo a voltage drop by a transistor threshold voltage. Thus, to produce a bootstrap effect, an input signal needs to have an amplitude that is at least 1.5 to 2 times larger than a threshold voltage of transistors forming the circuit. For this reason, if a circuit receives an input signal having a small amplitude, the circuit does not operate, resulting in a narrow operating margin. Namely, when the threshold voltage of transistors forming the circuit is not sufficiently smaller than the amplitude or voltage of an inputted signal, the circuit may be problematic. One example of such circuit is a level shift circuit that increases a small amplitude of an input signal.

In addition, when manufacture variations of transistor threshold voltages are large, the circuit may be problematic, since the circuit operating margin is narrowed. For example, if a thin film transistor (TFT) technique is used, and pixel transistors, word line driving circuits, or the like are simultaneously formed by TFTs of a single conductivity type on a substrate of a display device, advantages such as reduction of manufacturing costs and improvement of reliability of scanning line connection can be gained. However, generally, TFTs have a large threshold voltage, and manufacture variations thereof are also large. Thus, to form a level shift circuit by using TFTs, a technique for manufacturing TFTs having an even and controlled threshold voltage is required.

According to an aspect of the present invention, there is provided a bootstrap circuit comprising: a first transistor connecting a first power supply with an output terminal; and a second transistor applying a first input signal to a gate node of the first transistor and having a conductivity type identical to that of the first transistor. A second input signal obtained by inverting a level of the first input signal, delaying the inverted signal, and adding a direct current bias to the delayed signal is inputted to a gate node of the second transistor.

According to the present invention, an input signal having an amplitude that is at least 1.5 to 2 times larger than a threshold voltage of transistors forming a circuit is not needed to produce a bootstrap effect. Thus, a circuit having a wide operating margin with respect to an amplitude of an input signal can be provided.

PREFERRED MODES

It is noted that the reference numerous and symbols mentioned in "PREFERRED MODES" are indicated merely for the illustrative purpose for helping the understanding of the invention without restrictive intent.

A bootstrap circuit according to an exemplary embodiment of the present invention includes: a first transistor (1 in FIG. 1) connecting a first power supply (V5 in FIG. 1) and an output terminal (Out in FIG. 1); and a second transistor (2 in FIG. 1) applying a first input signal (In in FIG. 1) to a gate node of the first transistor and having a conductivity type identical to that of the first transistor. A second input signal (Inbd in FIG. 1) obtained by inverting a level of the first input signal, delaying the inverted signal, and adding a direct current bias to the delayed signal is inputted to a gate node of the second transistor.

The second transistor applies the first input signal to the gate node of the first transistor. When a potential at the gate node is changed by a bootstrap effect, since the second input signal is delayed, the second transistor is brought into a non-conductive state. In this way, change of the potential at the gate node is not prevented. Since a DC bias voltage is applied to the gate node of the second transistor, the first input signal can be applied to the gate node of the first transistor, without undergoing a voltage drop by a threshold voltage of the transistor. As long as this applied voltage exceeds a threshold voltage of the first transistor, a bootstrap effect is produced.

Thus, the bootstrap circuit can be operated with an input signal having a small amplitude approximately equal to a threshold voltage of transistors forming the circuit. In other words, the bootstrap circuit can be operated, even when an amplitude of the input signal is 1 to 1.5 times higher than a threshold voltage of transistors forming the circuit. Namely, a bootstrap circuit with low power consumption can be provided.

Additionally, even if variations of transistor characteristics are caused during manufacturing or by long-term use, a wide operating margin with respect to a transistor threshold voltage is ensured. Thus, a bootstrap circuit with high yield and reliability can be provided.

Figure 1:
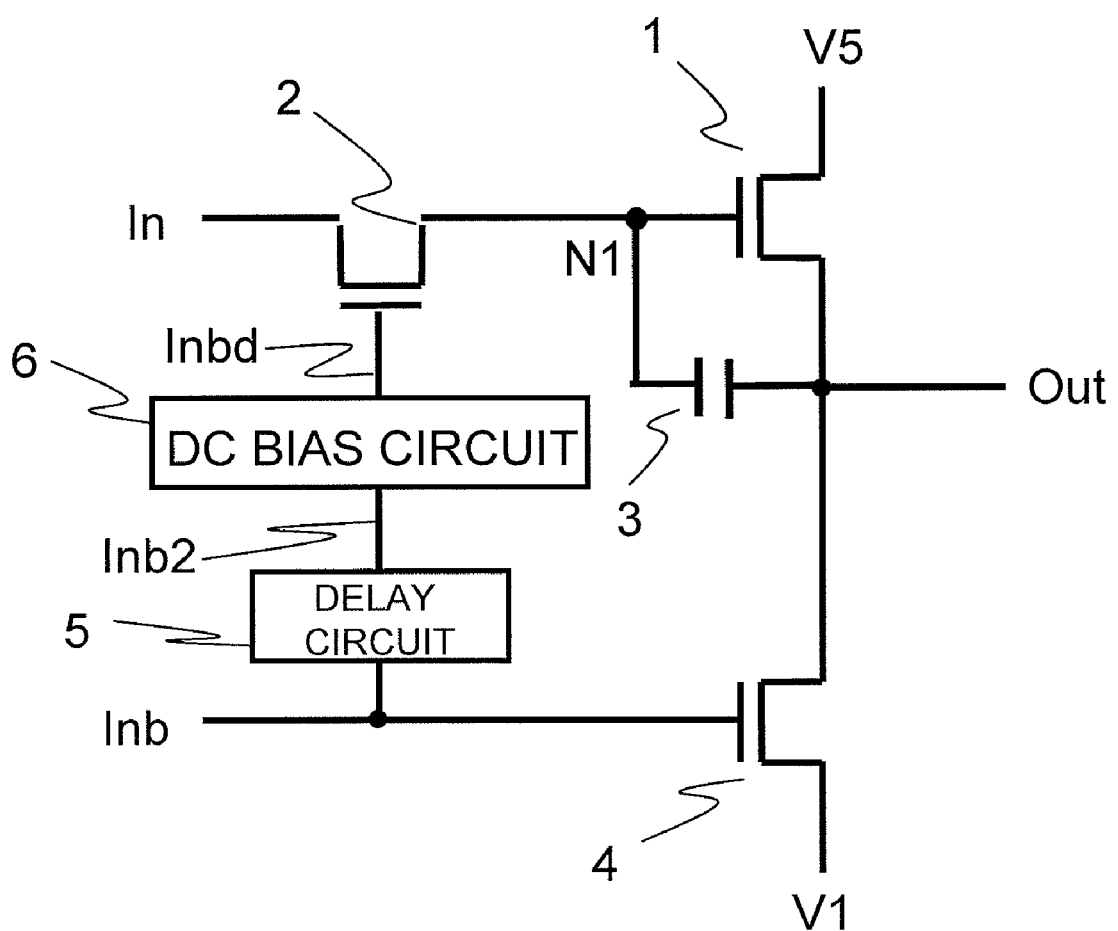
FIG. 1 is a block diagram of a bootstrap circuit according to a first example of the present invention.

The bootstrap circuit may further include a signal delay circuit (5 in FIG. 1) and a direct current bias circuit (6 in FIG. 1). The signal delay circuit and the direct current bias circuit may be connected in series to the gate node of the second transistor and arranged for a level-inverted signal of the first input signal.

Based on the bootstrap circuit, the signal delay circuit may be connected to the gate node of the second transistor, and the direct current bias circuit may be connected to a source or drain node of the second transistor.

Based on the bootstrap circuit, the direct current bias circuit may be arranged between the signal delay circuit and the gate node of the second transistor, and the bootstrap circuit may further include a fourth transistor (7 in FIG. 12) connecting an output node of the signal delay circuit and a second power supply and having a conductivity type identical to that of the first transistor. The fourth transistor has a gate node connected to the gate node of the first transistor.

Based on the above bootstrap circuit, when the second transistor applies the first input signal to the gate node of the first transistor, the fourth transistor forcibly brings the second transistor in a non-conductive state. Thus, when the potential at the gate node of the first transistor is changed by a bootstrap effect, change of the potential is not prevented.

In addition, even if the delay circuit causes an excessive signal delay, the bootstrap circuit can be operated. This is because, even if the signal delay circuit fails to bring the second transistor into a non-conductive state at an appropriate timing, the fourth transistor brings the second transistor in a non-conductive state at an appropriate timing.

The bootstrap circuit may further include a third transistor (4 in FIG. 1) connecting a second power supply (V1 in FIG. 1) and the output terminal and having a conductivity type identical to that of the first transistor, and a level-inverted signal (Inb in FIG. 1) of the first input signal may be applied to a gate node of the third transistor.

Based on the above bootstrap circuit, when the first input signal brings the first output transistor into a conductive state, the second input signal, which is an inverted signal of the first input signal, brings the second transistor in a non-conductive state. Namely, the bootstrap circuit can be operated by the first input signal as a single signal.

Based on the bootstrap circuit, the direct current bias circuit may add a direct current bias voltage that is at least equal to or more than a threshold voltage of the second transistor.

Based on the above bootstrap circuit, since the direct current bias circuit adds a direct current bias voltage that is at least equal to or more than a threshold voltage of the second transistor, the second transistor can be maintained in a conductive state. In addition, the first input signal can be applied to the gate node of the first transistor, without being decreased by the threshold voltage of the second transistor.

Figure 6:
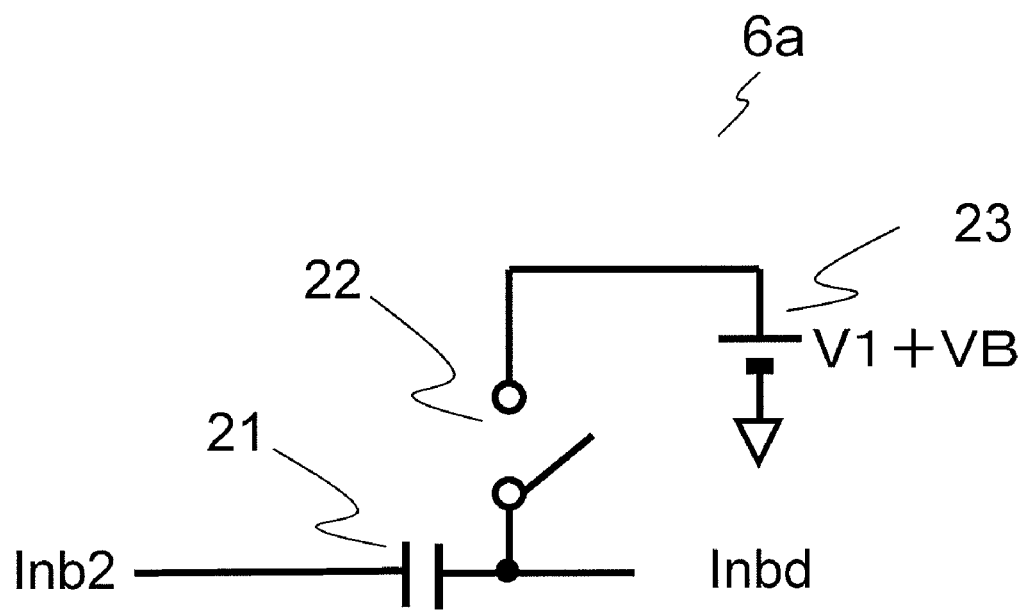
FIG. 6 is a block diagram of a configuration of a direct current (DC) bias circuit.

Based on the bootstrap circuit, the direct current bias circuit may include a capacitive element (21 in FIG. 6) connecting input and output nodes of the direct current bias circuit and a switch element (22 in FIG. 6) connecting the output node and a bias voltage supply (23 in FIG. 6).

Based on the bootstrap circuit, the direct current bias circuit may include: a first capacitive element (21 in FIG. 8) connecting input and output nodes of the direct current bias circuit; a second capacitive element (24 in FIG. 8) having one end thereof supplied with an inverted signal (In2 in FIG. 8) of a signal (Inb2 in FIG. 8) inputted to the input node; a first switch element (22 in FIG. 8) connecting the output node and a bias voltage supply (23 in FIG. 8); and a second switch element (25 in FIG. 8) connecting the other end of the second capacitive element and the bias voltage supply. A gate node of the first switch element and the other end of the second capacitive element may be connected to each other, and a gate node of the second switch element and the output node may be connected to each other.

The above DC bias circuit can carry out a direct current bias operation, as long as the signal inputted to the input node and the inverted signal have an amplitude exceeding a threshold voltage of the first and second switch elements.

Based on the bootstrap circuit, the signal delay circuit may include a plurality of inverting circuits (31 in FIG. 3) connected in series.

Based on the bootstrap circuit, the signal delay circuit may include: a series resistor (32 in FIG. 4) connecting input and output nodes of the signal delay circuit; and a capacitive element (33 in FIG. 4) having one end connected to the output node and the other end supplied with a fixed potential.

Based on the bootstrap circuit, the series resistor may be a transistor (34 in FIG. 5) having one end as a source node and the other end as a drain node.

Based on the bootstrap circuit, the capacitive element may be a transistor (35 in FIG. 5) having one end as source and drain nodes and the other end as a gate node.

A level shift circuit according to the present invention may include the above bootstrap circuit as an output circuit. Further, a word line driving circuit according to the present invention may include the above bootstrap circuit as an output circuit. Based on the level shift circuit or the word line driving circuit, even if the circuit receives an input signal having a small amplitude, the circuit can ensure a wide operating margin.

EXAMPLES

Next, examples of the present invention will be described in detail with reference to the drawings.

Example 1

FIG. 1 is a block diagram of a bootstrap circuit according to a first example of the present invention. In FIG. 1, the bootstrap circuit includes: a transistor 1 connecting a power supply V5 and an output terminal Out; a transistor 2 connecting a gate (node N1) of the transistor 1 and an input signal In; a coupling capacitor 3 connecting a source and the gate of the transistor 1; a transistor 4 connecting the output terminal Out and a power supply V1; a delay circuit 5; and a DC bias circuit 6. The delay circuit 5 and the DC bias circuit 6 are arranged between an input signal Inb and a gate of the transistor 2. In addition, the transistors 1, 2, and 4 are NMOS transistors.

The input signal In is a pulse signal that changes between a high level V2 and a low level V1. The input signal Inb is a logically inverted signal of the input signal In. Further, a pulse signal that changes between a high level V5 and a low level V1 is supplied to the output terminal Out. In addition, the power supply V5 may have a potential identical to that of a power supply V2. Further, the coupling capacitor 3 may be arbitrarily configured to realize a suitable circuit operation. For example, the coupling capacitor 3 may be configured to have only the source-gate coupling capacitance of the transistor 1. Alternatively, in addition to the coupling capacitance, parasitic capacitance between wirings may be used. Further alternatively, the coupling capacitor 3 may be designed so that additional capacitance can be added. The delay circuit 5 receives and temporally shifts the input signal Inb to obtain a signal Inb2. The delay circuit 5 outputs the signal Inb2 to the DC bias circuit 6, and the DC bias circuit 6 adds a DC bias voltage VB to the signal Inb2 to obtain a signal Inbd. The DC bias circuit 6 outputs the signal Inbd to the gate of the transistor 2.

Figure 2:
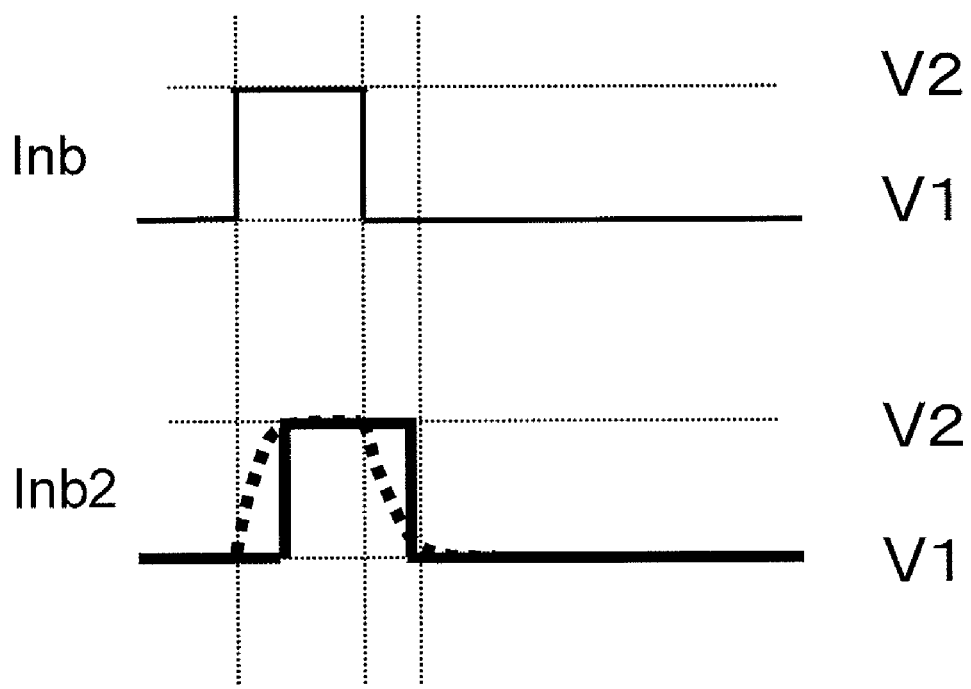
FIG. 2 is a timing diagram of an operation of a delay circuit.

FIG. 2 is a timing diagram of an operation of the delay circuit 5. The delay circuit 5 temporally (i.e., in terms of time) shifts the input signal Inb and outputs the signal Inb2. The signal Inb can be delayed by dulling pulse rise and fall time. Next, configuration examples of the delay circuit 5 will be described in detail.

Figure 3:
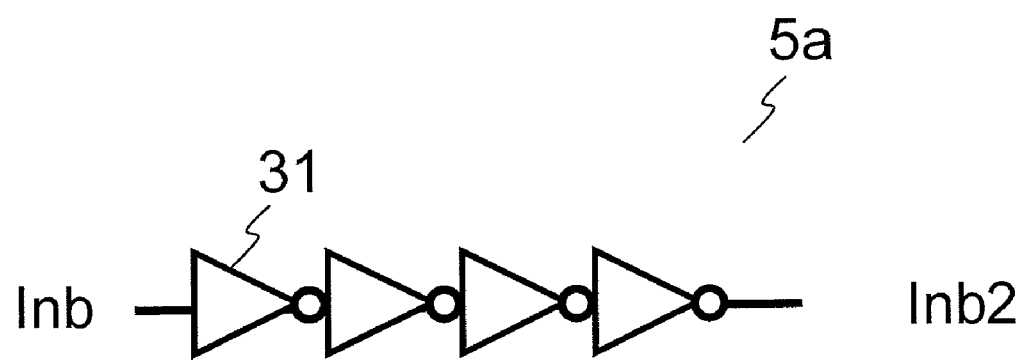
FIG. 3 is a block diagram of a configuration of the delay circuit.

FIG. 3 illustrates a delay circuit 5a that generates the output signal as described above and that may be used as the delay circuit 5. By connecting a plurality of inverting circuits 31 in series, a propagation delay can be generated.

Figure 4:
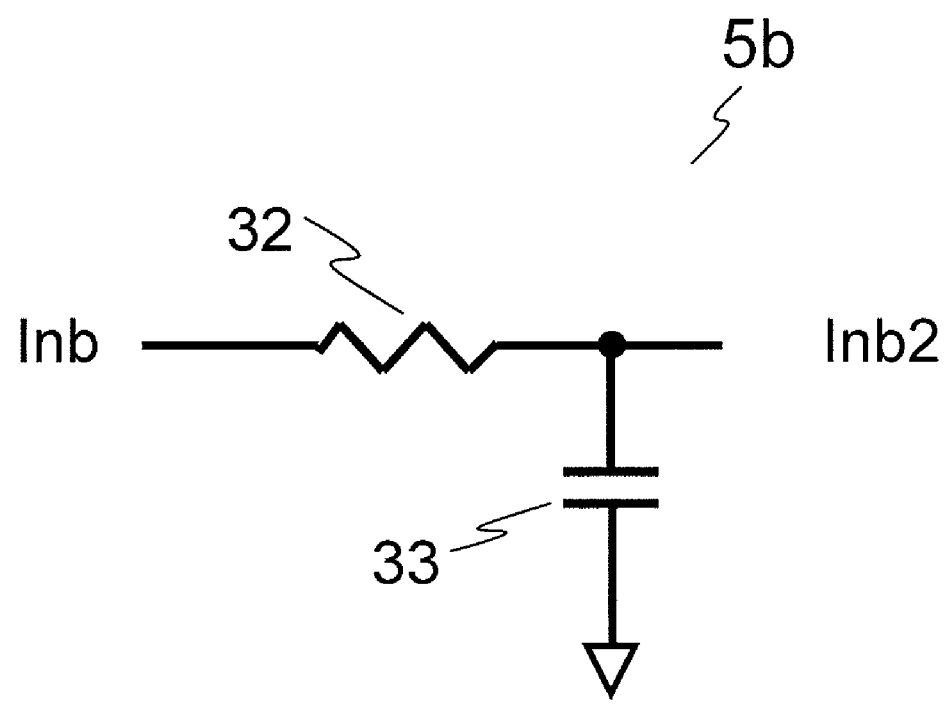
FIG. 4 is a block diagram of another configuration of the delay circuit.

Further, a delay circuit 5b as illustrated in FIG. 4 may be used as the delay circuit 5. The delay circuit 5b can be configured by connecting a resistor 32 between the input signal Inb and the signal Inb2 and a capacitor 33 between the signal Inb2 and the ground. In this way, based on a CR time constant obtained by the resistor 32 and the capacitor 33, the rise time and fall time are dulled.

Figure 5:
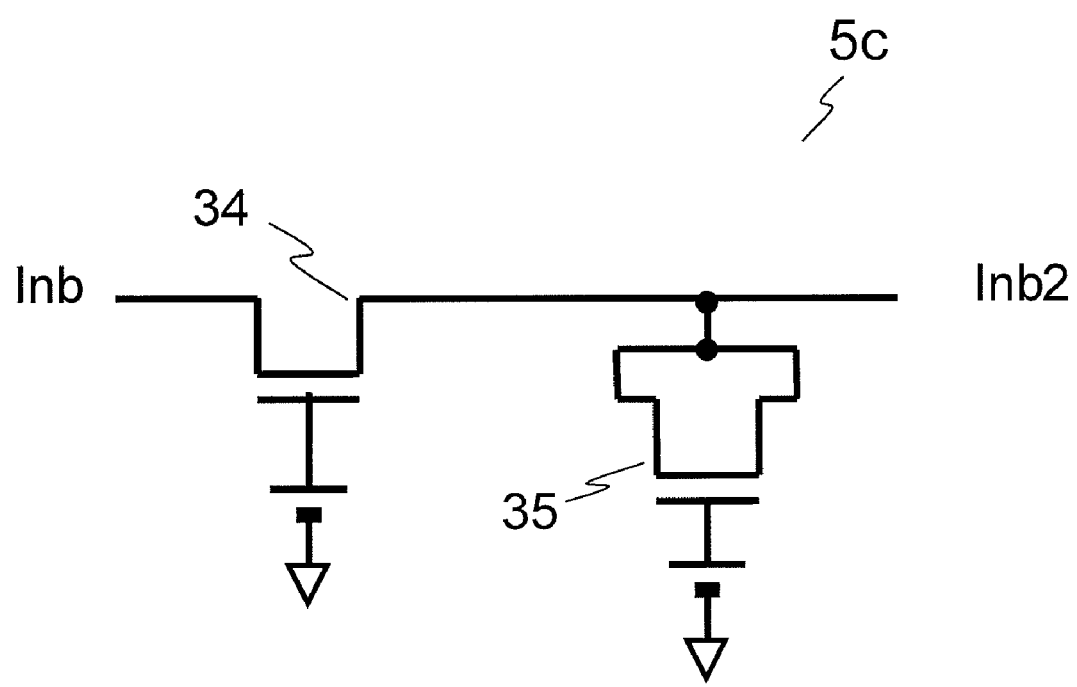
FIG. 5 is a block diagram of still another configuration of the delay circuit.

Further, the resistor 32 and the capacitor 33 of the delay circuit 5b in FIG. 4 may be replaced with a source-drain resistance 34 of a transistor and a MOS capacitance 35 of a transistor, to form a delay circuit 5c as illustrated in FIG. 5. Based on the delay circuit 5c in FIG. 5, by adjusting bias voltages applied to gates of the respective transistors, values of the resistance 34 and the capacitance 35 can be changed, whereby a delay time can be adjusted. Further alternatively, a plurality of the delay circuits in FIGS. 3 to 5 may be connected in series and used as the delay circuit 5.

Figure 7:
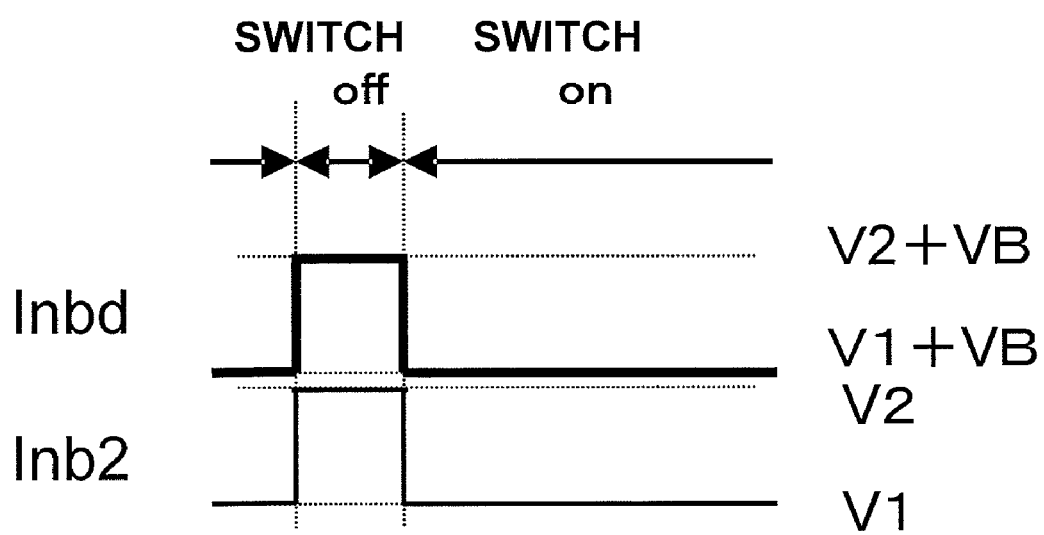
FIG. 7 is a timing diagram of an operation of the DC bias circuit.

Next, a DC bias circuit 6a, which is an example of the DC bias circuit 6, will be described. FIG. 6 is a block diagram of the DC bias circuit 6a, and FIG. 7 is a timing diagram of an operation of the DC bias circuit 6a. As illustrated in FIG. 6, the DC bias circuit 6a receives the signal Inb2 and outputs the signal Inbd. A capacitor 21 is connected between the signals Inb2 and the Inbd, and a switch 22 is connected between a bias power supply 23 outputting a voltage V1+VB and the signal Inbd. Based on an operation of such a circuit, as illustrated in FIG. 7, when the input signal Inb2 is at a low level (V1), the switch 22 is closed, so as to bring the potential of the output signal Inbd to be V1+VB and charge the capacitor 21 with the voltage of the bias power supply 23. When the input signal Inb2 is inverted and increased to a high level V2, the switch 22 is opened. Accordingly, the signal Inbd is increased to a boosted voltage V2+VB (addition of the voltage of the capacitor 21 to V2). Namely, the output signal Inbd is obtained by adding a DC bias voltage VB to the input signal Inb2.

Figure 8:
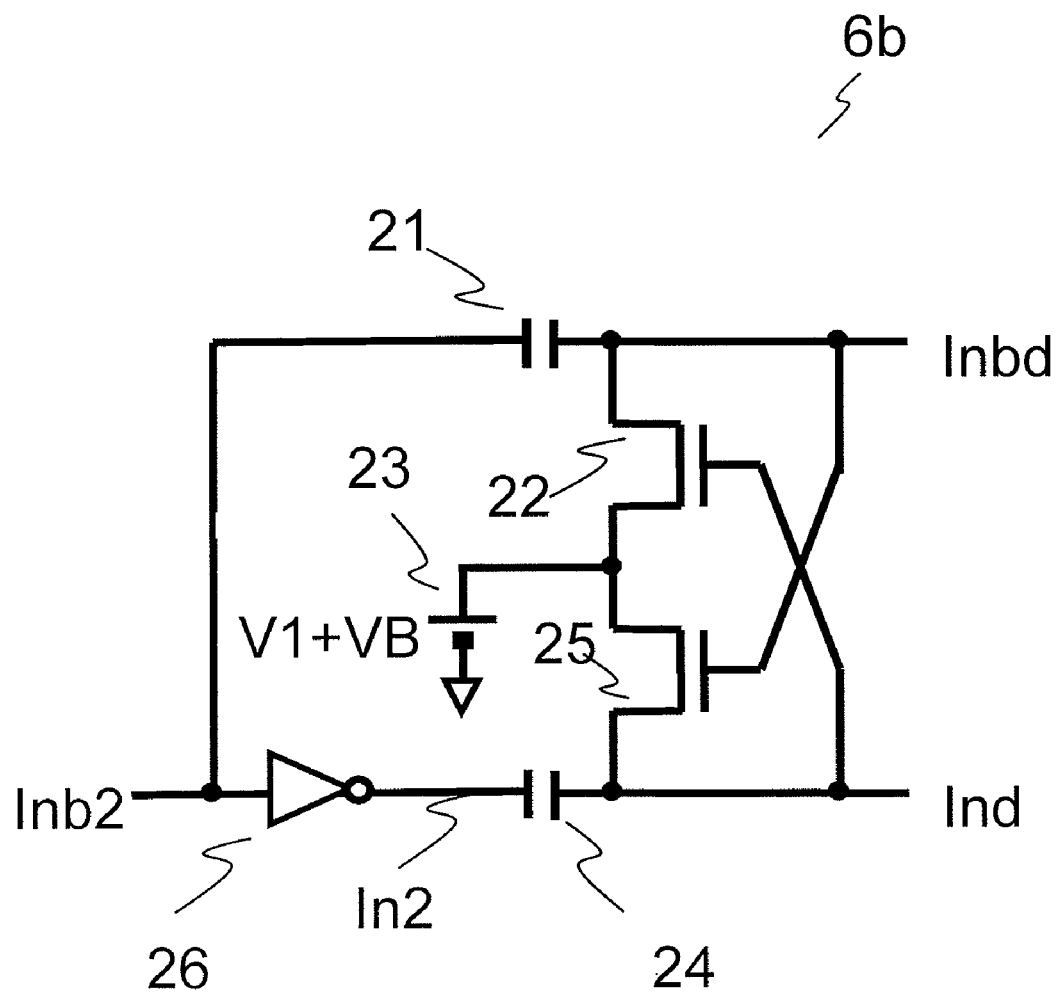
FIG. 8 is a block diagram of another configuration of the DC bias circuit.

FIG. 8 is a block diagram of a DC bias circuit 6b, which is another example of the DC bias circuit 6. The DC bias circuit 6b of FIG. 8 includes switches 22 and 25 (N-type MOS transistors) that perform a toggle operation. More specifically, when the signal Inb2 is increased to the high level V2, the signal Inbd is increased to V2+VB. Accordingly, since the switch 25 is brought in a conductive state, the signal Ind is brought to be a low level that corresponds to the bias power supply potential V1+VB. As a result, the switch 22 is brought into a non-conductive state. In contrast, when the signal Inb2 is decreased to the low level V1, since the signal Ind is increased, the signal Inbd is decreased to the low level V1+VB. When the switch 25 is in a conductive state, the potential at a gate node (Inbd) of the switch 25 is V2+VB, and the potential at a source node (Ind) of the switch 25 is V1+VB at a maximum. Namely, since the gate-source voltage of the N-type MOS transistor forming the switch 25 is VB, the DC bias circuit 6b functions as long as this voltage is above a threshold voltage Vth.

Figure 9:
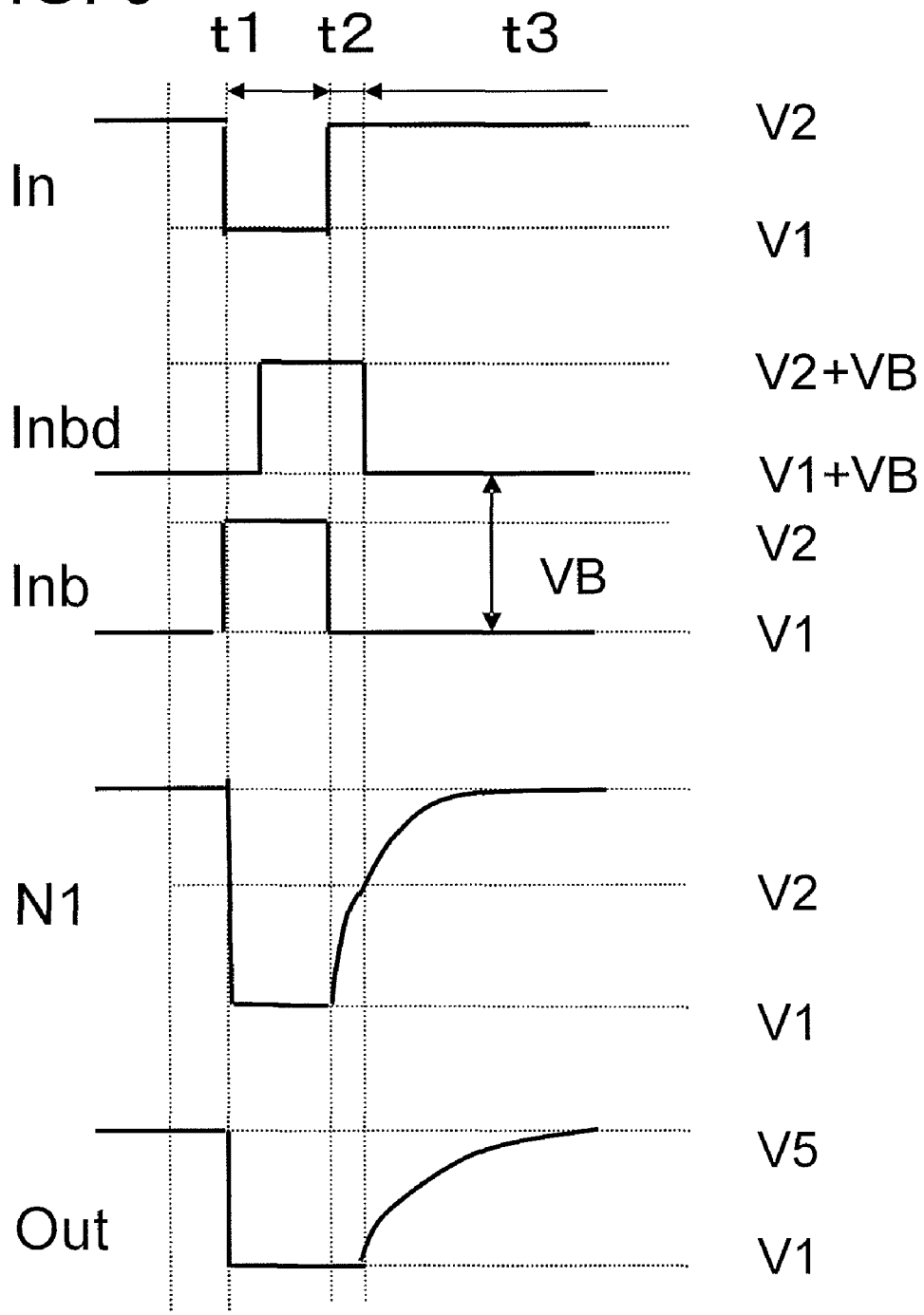
FIG. 9 is a timing diagram of an operation of the bootstrap circuit according to the first example of the present invention.

Next, an operation of the bootstrap circuit will be described. FIG. 9 is a timing diagram of an operation of the bootstrap circuit illustrated in FIG. 1. First, in a period t1, the signal Inb is increased to the high level (V2). Since the transistor 4 is brought into a conductive state, the potential at the output terminal Out is decreased to the low level V1. The signal Inbd applied to the gate of the transistor 2 is a signal obtained by temporally shifting the signal Inb and adding the DC bias voltage VB. Thus, the signal Inbd changes between the high level V2+VB and the low level V1+VB. When the signal In is decreased to the low level V1, the transistor 2 is brought into a conductive state. This is because the signal Inbd applied to the gate of the transistor 2 is higher than the signals In and Inb by the voltage VB. Consequently, the potential at the gate (node N1) of the transistor 1 is decreased to the low level V1, and the transistor 1 is brought into a non-conductive state.

Next, in a period t2, the signals Inb and In are inverted to the low level V1 and the high level V2, respectively. Since the signal Inbd is temporally delayed, the signal Inbd remains at the high level V2+VB. Here, by setting the bias voltage VB at such a level that the transistor can be brought into a conductive state when the bias voltage VB is a gate-source voltage Vgs of the transistor. The transistor 2 is maintained in a conductive state, and the node N1 is charged to the high level V2. Since the gate (node N1) of the transistor 1 is at the high level V2 and the source (Out) is at the low level V1, the transistor 1 is brought into a conductive state, and the potential at the source (Out) begins to increase toward the power supply V5. Simultaneously, a bootstrap effect is produced, that is, the potential at the gate (node N1) connected to the coupling capacitor 3 is also increased.

Next, in a period t3, since the delayed signal Inbd is inverted to the low level V1+VB, the transistor 2 is brought into a non-conductive state. Thus, the node N1 is brought in a floating state, and the potential at the node N1 is increased above the power supply V5 by a bootstrap effect. As a result, the potential at the output terminal Out reaches the high level V5.

Characteristics of such bootstrap circuit will be hereinafter described. First, the potential at the node N1 is increased to the high level V2 that corresponds to the level of the input signal In in the period t2, without being decreased by a threshold voltage of the transistor 2. Therefore, assuming that a threshold voltage of the transistor 1 is Vth, a minimum requirement to produce a bootstrap effect is relaxed (improved) to V2−V1>Vth. Namely, a bootstrap effect can be produced as long as the signal amplitude (V2−V1) is greater than the threshold voltage Vth. Second, in the period t3, since the transistor 2 is in a non-conductive state, the voltage increase at the node N1 by the bootstrap effect is not prevented. These characteristics are provided by arranging the delay circuit 5 and the DC bias circuit 6 between the input signals In and Inb, delaying the signal Inb, and adding a DC offset component to the delayed signal Inb.

Next, the bias voltage VB will be described. In the case of an NMOS transistor, if the threshold voltage thereof is Vth, the bias voltage VB needs to be equal to or more than Vth. This is because when Vgs>Vth in the period t2, the transistor 2 is brought into a conductive state. Further, the bias voltage VB needs to be lower than the sum of the amplitude (V2−V1) of the input signal In and Vth. This is because when Vgs<Vth in a period t3, the transistor 2 is brought into a non-conductive state. While the bias voltage VB can be suitably set within the above ranges, an input signal high level V2 may be used, for example.

In the above description, the signal delay circuit 5 and the DC bias circuit 6 are connected in this order. However, as long as objects and advantages of the present invention are accomplished, the signal delay circuit 5 and the DC bias circuit 6 may be connected in a reverse order. Further, while the signal Inbd is DC-biased relative to the signals In and Inb, the present invention is not limited to such example. Advantages of the present invention can be obtained even when the input signals In and Inb are DC-biased, instead of the signal Inbd. This point will be described in a second example below.

Example 2

Figure 10:
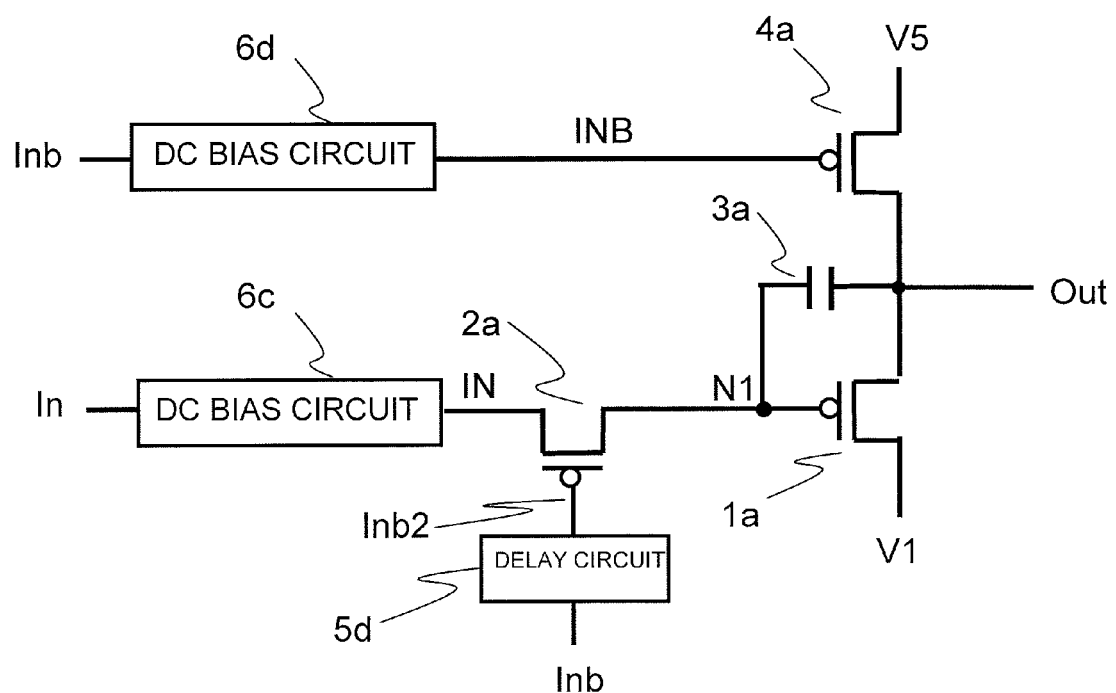
FIG. 10 is a block diagram of a bootstrap circuit according to a second example of the present invention.

FIG. 10 is a block diagram of a bootstrap circuit according to a second example of the present invention. In FIG. 10, the bootstrap circuit includes: a transistor 1a connecting a power supply V1 and an output terminal Out; a transistor 2a connecting a gate (node N1) of the transistor 1a and a signal IN; a coupling capacitor 3a connecting a source and the gate of the transistor 1a; a transistor 4a connecting the output terminal Out and a power supply V5; a signal INB inputted to a gate of the transistor 4a; a delay circuit 5d arranged between an input signal Inb and a gate of the transistor 2a; a DC bias circuit 6c supplying a DC bias voltage to an input signal In to output a signal IN; and a DC bias circuit 6d supplying a DC bias voltage to the input signal Inb to output the signal INB. In addition, the transistors 1a, 2a, and 4a are PMOS transistors. The delay circuit 5d and the DC bias circuits 6c and 6d can be configured equivalently to the various delay circuits and DC bias circuits described in the first example.

The input signals In and Inb change between a high level V2 and a low level V1, and the signals IN and INB are obtained by adding a DC bias voltage VB to the signal Inb. Regarding the polarity of the DC bias voltage VB, in the case of a PMOS transistor, the signals IN and INB are positively biased with respect to the signal Inb. Namely, with respect to the signal inputted to the gate node of the transistor 2a, the signal inputted to the gate node N1 of the transistor 1a is positively biased. This is opposite to example 1 where NMOS transistors are used. A pulse signal that changes between a high level V5 and a low level V1 is outputted from the output terminal Out. The DC bias voltage VB is set so that V2+VB is equal to V5. The coupling capacitor 3a may be arbitrarily configured to realize a suitable circuit operation. For example, the coupling capacitor 3 may be configured to have only the source-gate coupling capacitance of the transistor 1a. Alternatively, in addition to the coupling capacitance, parasitic capacitance between wirings may be used. Further alternatively, the coupling capacitor 3a may be designed so that additional capacitance can be added. The signal delay circuit 5d receives and temporally shifts the input signal Inb to obtain a signal Inb2. The delay circuit 5d outputs the signal Inb2 to the gate of the transistor 2a.

Figure 11:
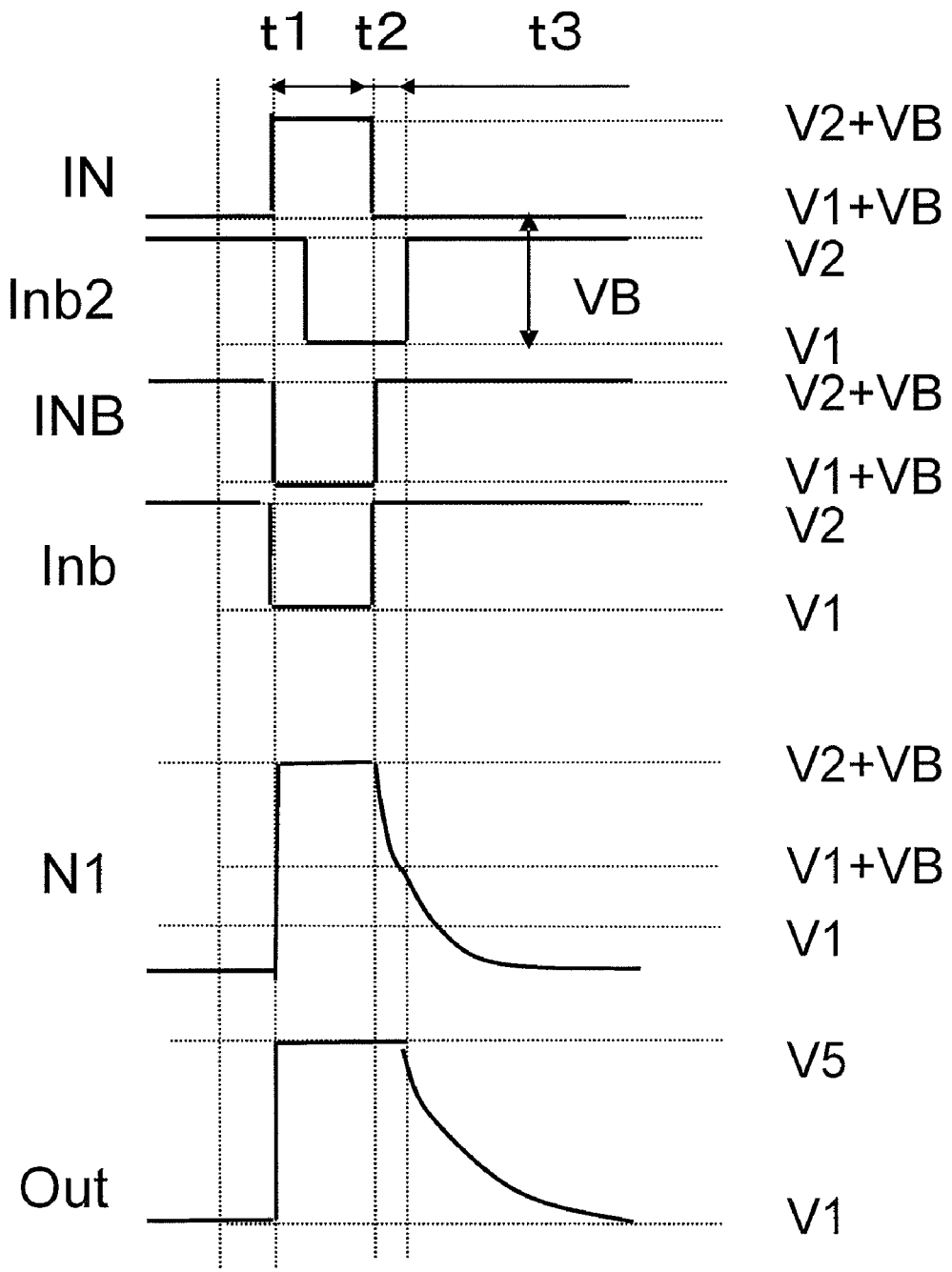
FIG. 11 is a timing diagram of an operation of the bootstrap circuit according to the second example of the present invention.

Next, an operation of the above bootstrap circuit will be described. FIG. 11 is a timing diagram of an operation of the bootstrap circuit according to the second example of the present invention. First, in a period t1, the signal INB is decreased to a low level. Since the transistor 4a is brought in a conductive state, the potential at the output terminal Out is increased to the high level V5. The signal Inb2 applied to the gate of the transistor 2a is a signal obtained by temporally shifting the signal Inb. When the signal IN is increased to a high level, the transistor 2 is brought in a conductive state. This is because the potential at the gate of the transistor 2 (signal Inb2) is lower than the signal IN by the voltage VB. Consequently, the potential at the gate (node N1) of the transistor 1a is increased to the high level V2+VB, and the transistor 1a is brought in a non-conductive state.

Next, in a period t2, the signals INB and IN are inverted to the high level V2+VB and the low level V1+VB, respectively. Since the signal Inb2 is temporally delayed, the signal Inb2 remains at the low level V1. The bias voltage VB is set at such a level that the transistor can be brought into a conductive state when the bias voltage VB is a gate-source voltage Vgs of the transistor. In this way, the transistor 2a is maintained in a conductive state, and the node N1 is charged to the low level V1+VB, which is equal to the low level of the signal IN. Since the gate (node N1) of the transistor 1a is at the low level V1+VB and the source (Out) is at the high level V5, the transistor 1a is brought into a conductive state, and the potential at the source (Out) begins to decrease toward the power supply V1. Simultaneously, a bootstrap effect is produced, that is, the potential at the gate (node N1) connected to the coupling capacitor 3a is also decreased.

Next, in a period t3, since the delayed signal Inb2 is inverted to the high level V2, the transistor 2a is brought into a non-conductive state. Thus, the node N1 is brought into a floating state, and the potential at the node N1 is decreased below the power supply V1 by a bootstrap effect. As a result, the potential at the output terminal Out is decreased to the low level V1.

Example 3

Figure 12:
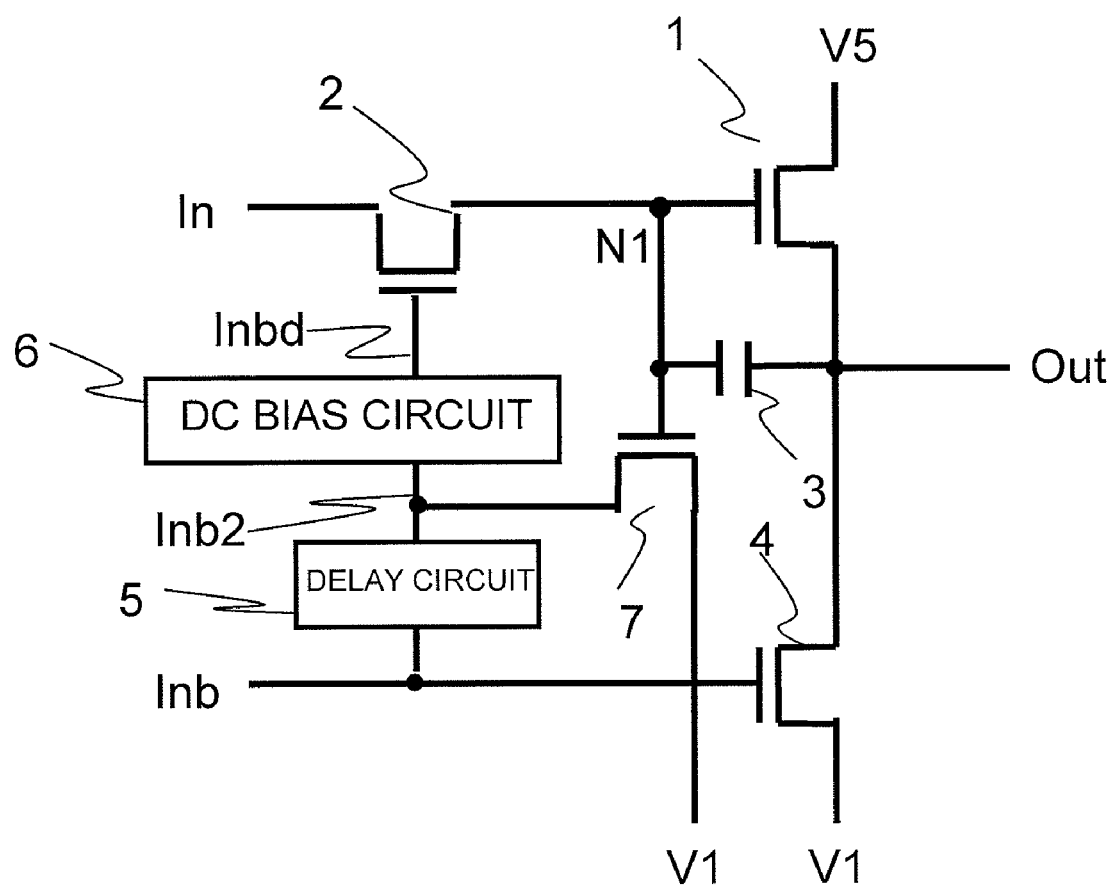
FIG. 12 is a block diagram of a bootstrap circuit according to a third example of the present invention.
Figure 13:
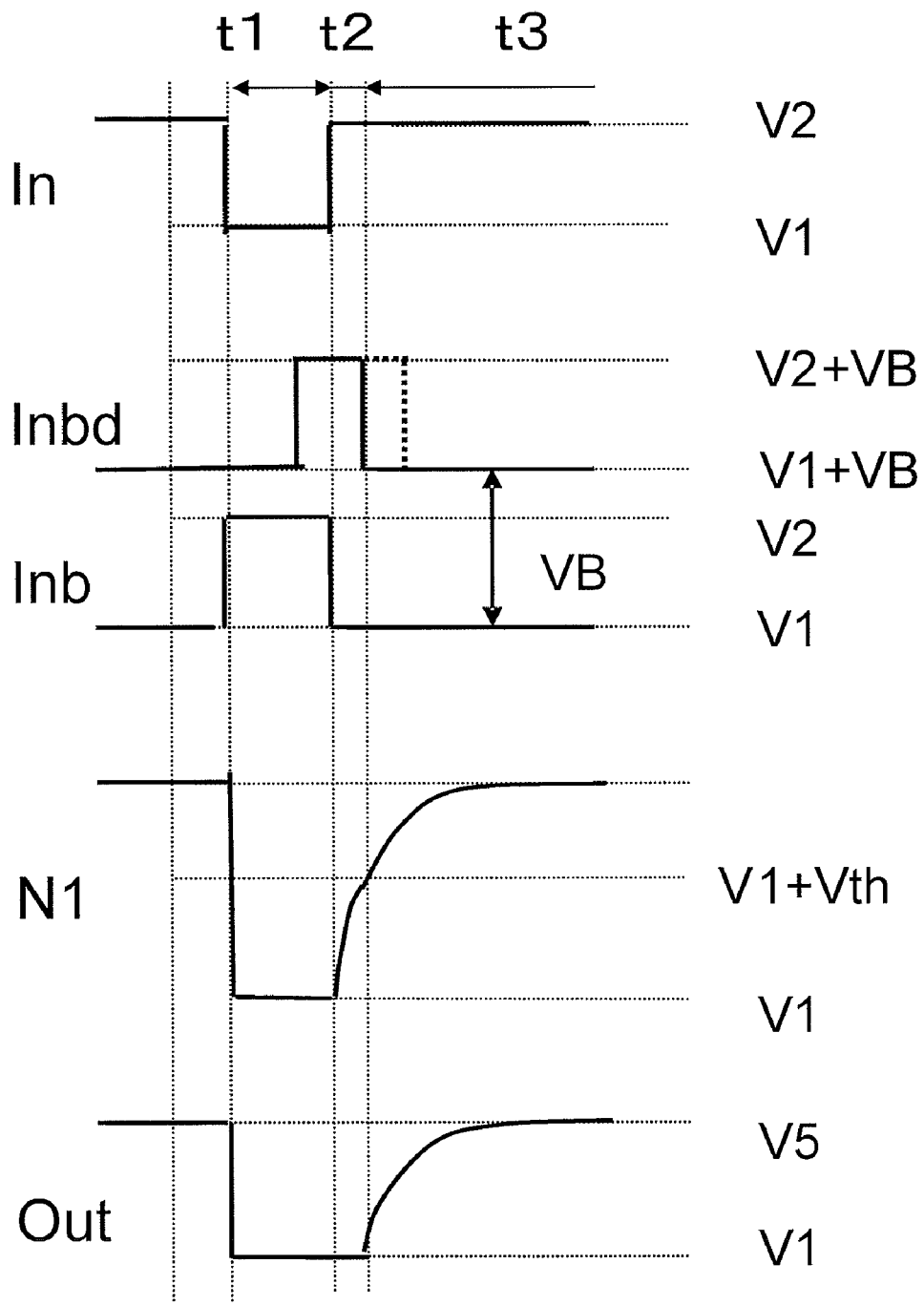
FIG. 13 is a timing diagram of an operation of the bootstrap circuit according to the third example of the present invention.

FIG. 12 is a block diagram of a bootstrap circuit according to a third example of the present invention. In FIGS. 1 and 12, like reference characters denote like elements, and the description thereof will be omitted. In addition to the configuration of the bootstrap circuit illustrated in FIG. 1, the bootstrap circuit according to the third example includes: a transistor 7 having a gate node connected to the node N1, a drain node connected to the output (signal Inb2) of the delay circuit 5, and a source node connected to the power supply V1. When a potential at the node N1 is increased to V1+Vth in a period t2 in FIG. 13, the transistor 7 is brought into a conductive state and forcibly decrease the output (signal Inb2) of the delay circuit 5 to the low level V1. Accordingly, the DC-biased signal Inbd is also decreased to the low level V1+VB. Thus, since the transistor 2 is brought into a non-conductive and the node N1 is brought in a floating state, the bootstrap effect of the transistor 1 is not prevented. If the bootstrap circuit does not include the transistor 7 and the delay circuit 5 carries out a signal delay excessively as illustrated by a dotted line of FIG. 13, the potential at the node N1 is maintained at the potential V2 in the period t3. In this case, since the potential increase at the node N1 and the output terminal Out by the bootstrap effect of the transistor 1 is prevented, high-speed inversion at the output terminal Out cannot be carried out.

In the above description, N- or P-type MOS transistors are used to form the bootstrap circuits according to examples 1 to 3. However, as long as objects and advantages of the present invention are accomplished, other elements such as thin-film transistors may be used.

Example 4

Figure 14:
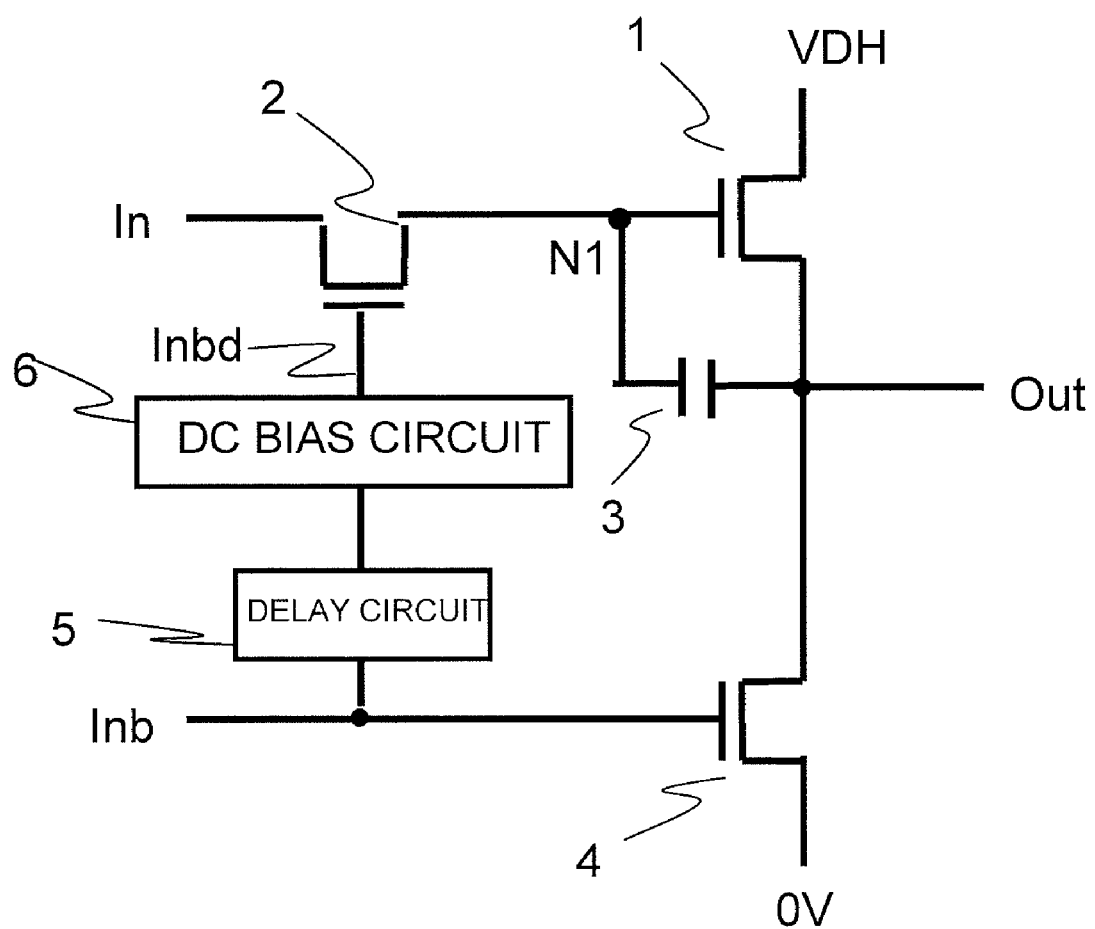
FIG. 14 is a block diagram of a level shift circuit according to a fourth example of the present invention.

FIG. 14 is a block diagram of a level shift circuit according to a fourth example of the present invention. In FIGS. 1 and 14, like reference characters denote like elements, and the description thereof will be omitted. The level shift circuit of FIG. 14 is an example where the bootstrap circuit of FIG. 1 is applied as a circuit amplifying an amplitude of a logic signal from low to high. The level shift circuit converts the input signals In and Inb having an amplitude VDD to a signal Out having an amplitude VDH (>VDD).

Figure 15:
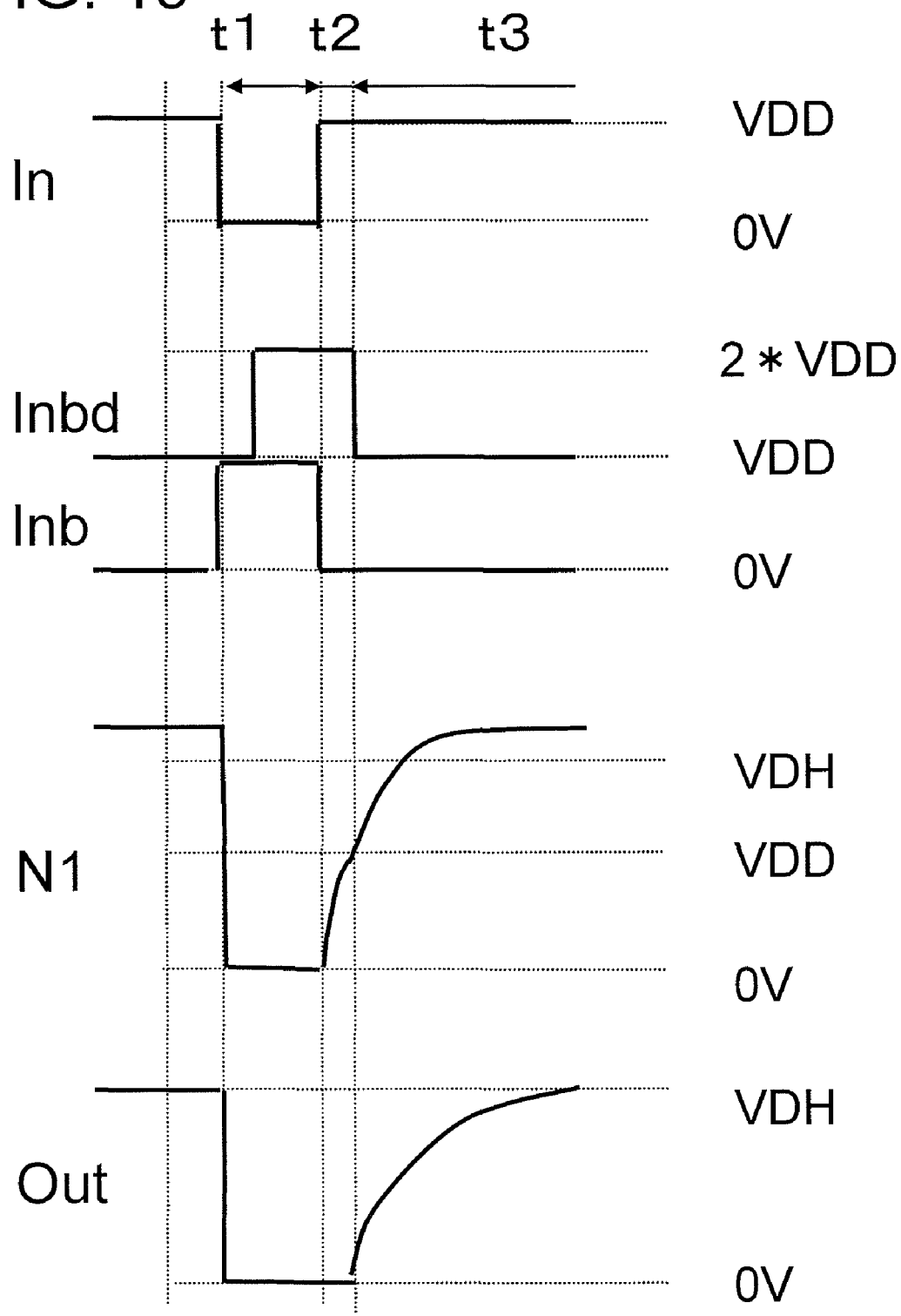
FIG. 15 is a timing diagram of an operation of the level shift circuit according to the fourth example of the present invention.

FIG. 15 is a timing diagram of an operation of the level shift circuit according to the fourth example of the present invention. FIG. 15 is a timing diagram substantially identical to that of FIG. 9 excepting signal names, and thus the description thereof will be omitted. As illustrated in FIG. 15, the signal Inbd is caused to lag the input signal Inb by the delay circuit 5 and is provided with an offset component VDD by the DC bias circuit 6.

According to the above level shift circuit, even if a circuit receives an input signal In having a small amplitude, a wide operating margin can be ensured.

Example 5

Figure 16:
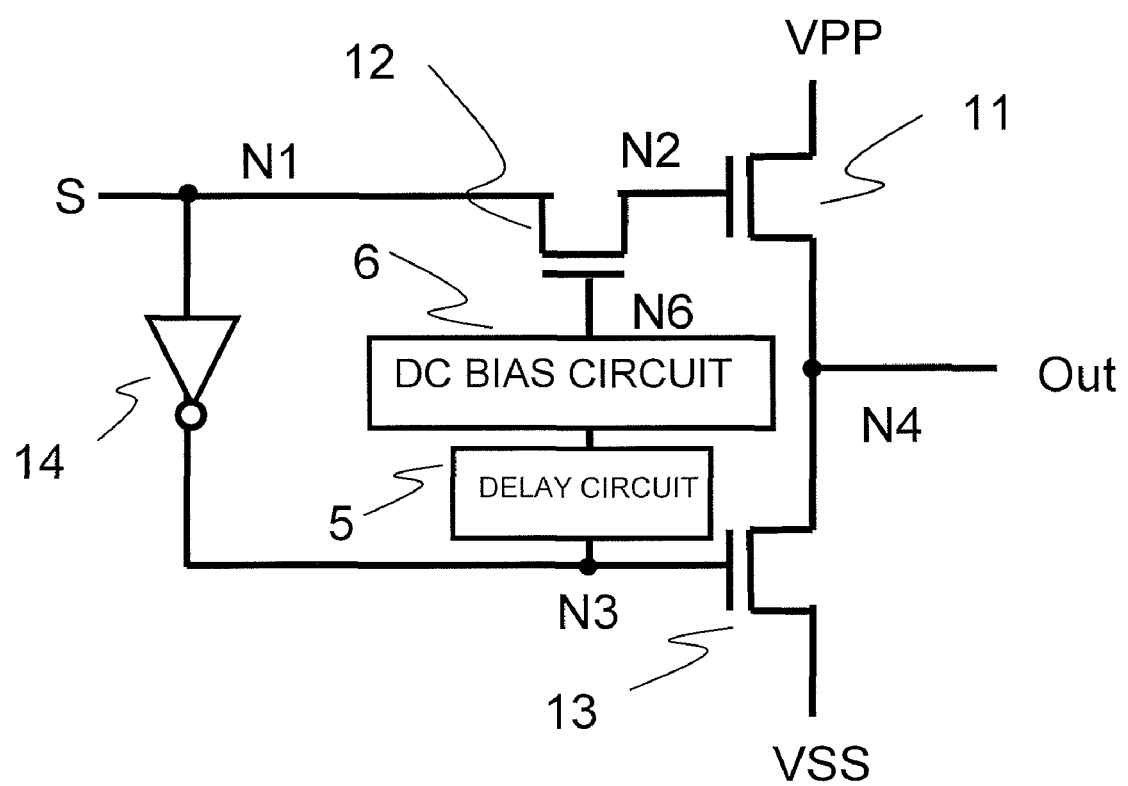
FIG. 16 is a block diagram of a word line driving circuit according to a fifth example of the present invention.

FIG. 16 is a block diagram of a word line driving circuit according to a fifth example of the present invention. FIG. 16 is an example where the bootstrap circuit of example 1 is applied as a memory device word line driving circuit. The word line driving circuit includes: a transistor 11 connecting a word line driving voltage VPP and an output signal terminal Out; a transistor 12 connecting a gate N2 of the transistor 11 and an input signal S; a transistor 13 connecting the output signal terminal Out and a power supply VSS; an inverter 14 inverting the input signal S; a delay circuit 5 delaying the inverted signal outputted from the inverter 14; and a DC bias circuit 6 supplying a DC offset component to the delayed signal outputted from the delay circuit 5 and outputting the resulting signal to a gate of the transistor 12. Such word line driving circuit has substantially the same configuration as the bootstrap circuit in FIG. 1. In addition, the transistors 11, 12, and 13 correspond to the transistors 1, 2, and 4 in FIG. 1, respectively.

Figure 17:
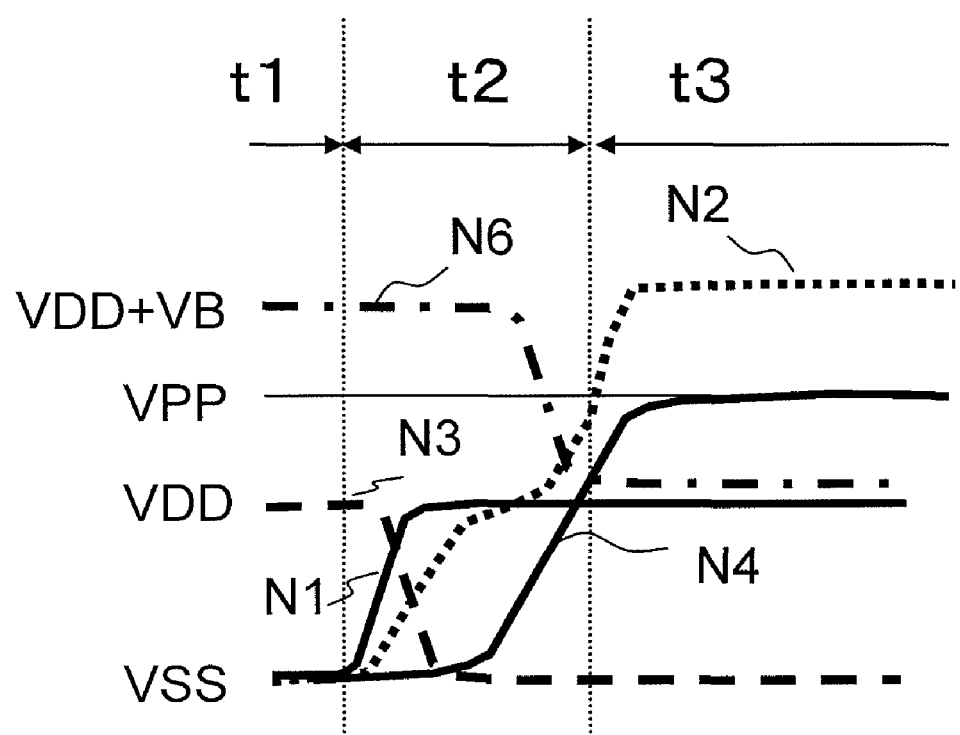
FIG. 17 is a timing diagram of an operation of the word line driving circuit according to the fifth example of the present invention.
Figure 18:
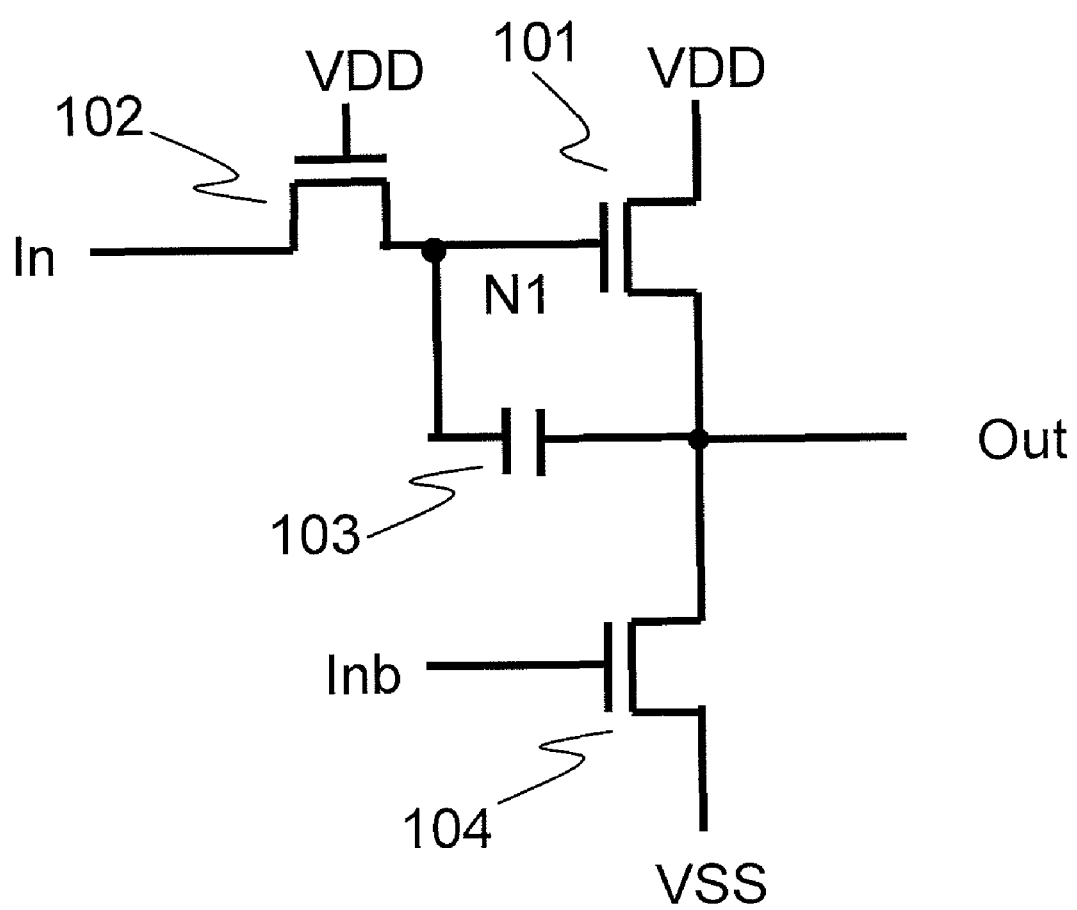
FIG. 18 is a block diagram of a conventional bootstrap circuit.
Figure 19:
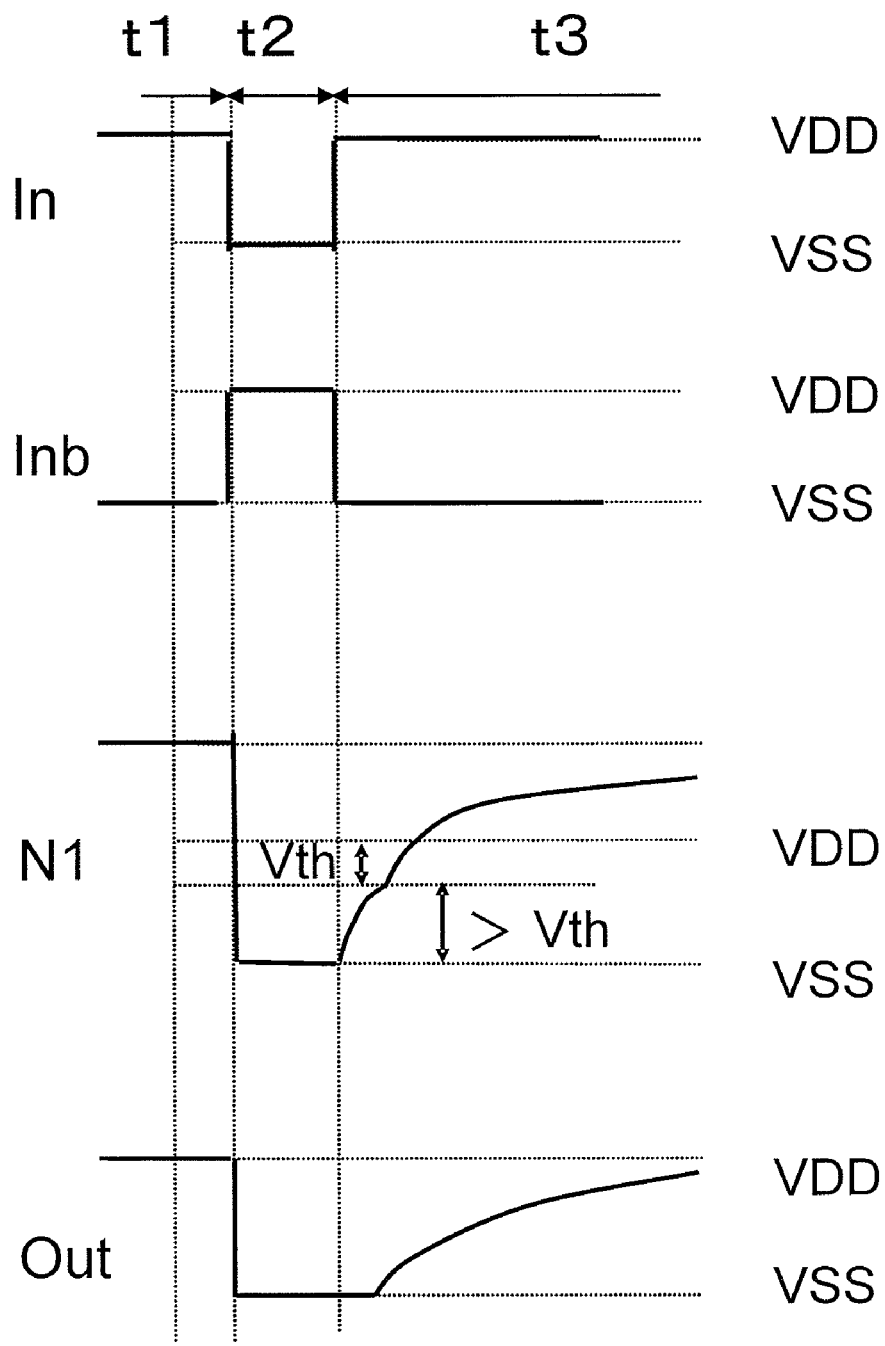
FIG. 19 is a timing diagram of an operation of the conventional bootstrap circuit, analyzed by the inventor of the present invention.

Next, an operation of the word line driving circuit will be described. FIG. 17 is a timing diagram of an operation of the word line driving circuit according to the fifth example of the present invention. The input signal S is a pulse signal that changes between a high level VDD and a low level VSS. First, in a period t1, the signal S at a node N1 is at the low level VSS, and a node N3 is at the high level VDD. Since the transistor 13 is in a conductive state, the potential at an output node N4 is at the low level VSS. Further, since a node N6 is at a high level VDD+VB, the transistor 12 is in a conductive state. Thus, the gate (node N2) of the transistor 11 is at the low level VSS (the same as the level of the signal S).

Next, upon reaching a timing t2, since the signal S (node N1) is inverted to the high level VDD and the node N3 is decreased to the low level VSS, the transistor 13 is brought into a non-conductive state. However, the delay circuit 5 maintains the node N6 at the high level VDD+VB. While the transistor 12 is maintained in a conductive state, the potential of the node N2 is charged to VDD. Since the node N4 is at the low level VSS in a floating state and the node N2 is brought to VDD, the transistor 11 is brought into a conductive state. As a result, the potential at the output node N4 begins to increase toward VPP.

Next, upon reaching a timing t3, when the delayed potential at the gate N6 is inverted and decreased to a low level, the transistor 12 is brought into a non-conductive state. Consequently, the gate (node N2) of the transistor 11 is brought into a floating state. Since both the node N2 and the node N4 are in a floating state, the potential at the output node N4 is increased to VPP by the bootstrap effect of the transistor 11. Simultaneously, the potential at the node N2 is increased above VPP, and the transistor 11 is maintained in a conductive state.

One of the characteristics of the word line driving circuit according to example 5 is that, since the potential at the gate N6 is maintained at the high level VDD+VB by the DC bias circuit 6 in the periods t1 and t2, the potential at the node N2 is not decreased by the threshold voltage of the transistor 12. Thus, the minimum requirement to produce a bootstrap effect is relaxed (improved) to VDD−VSS>Vth.

Figure 20:
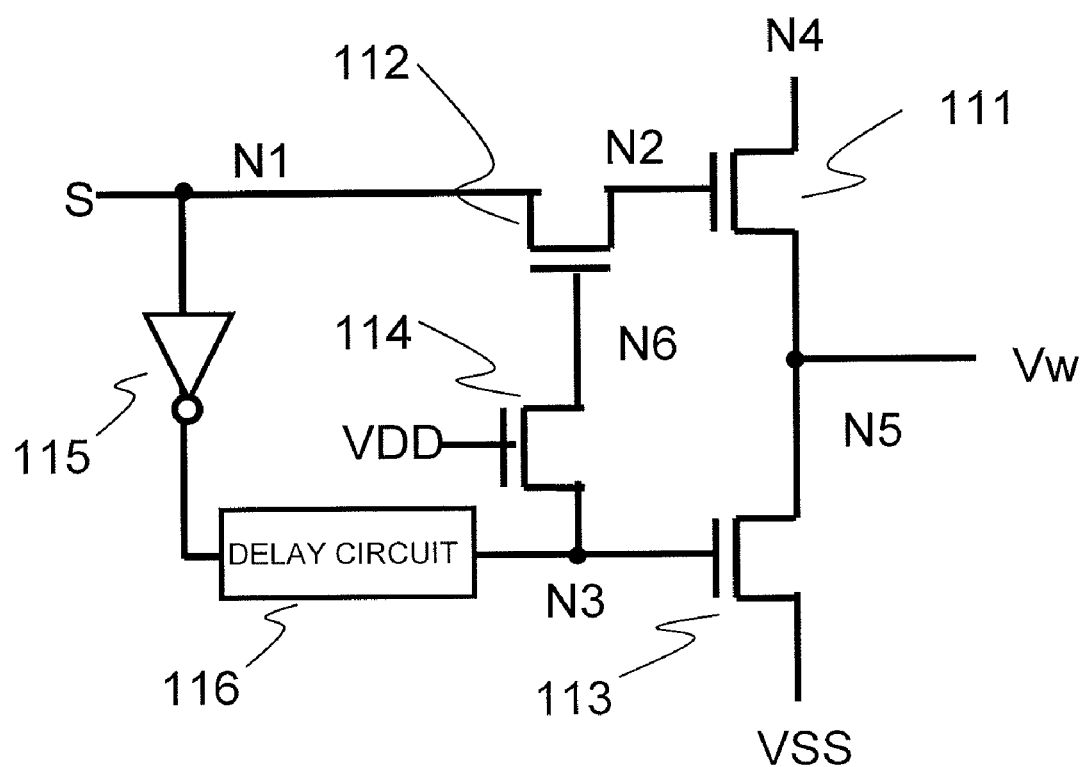
FIG. 20 is a block diagram of a conventional word line driving circuit.
Figure 21:
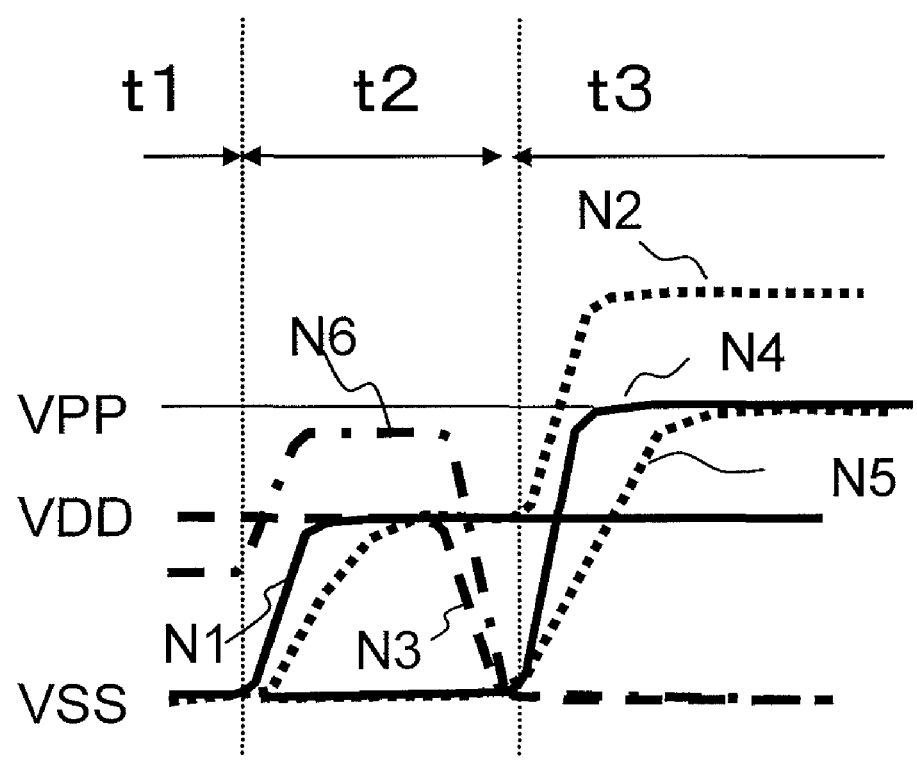
FIG. 21 is a timing diagram of an operation of the conventional word line driving circuit.
Figure 22:
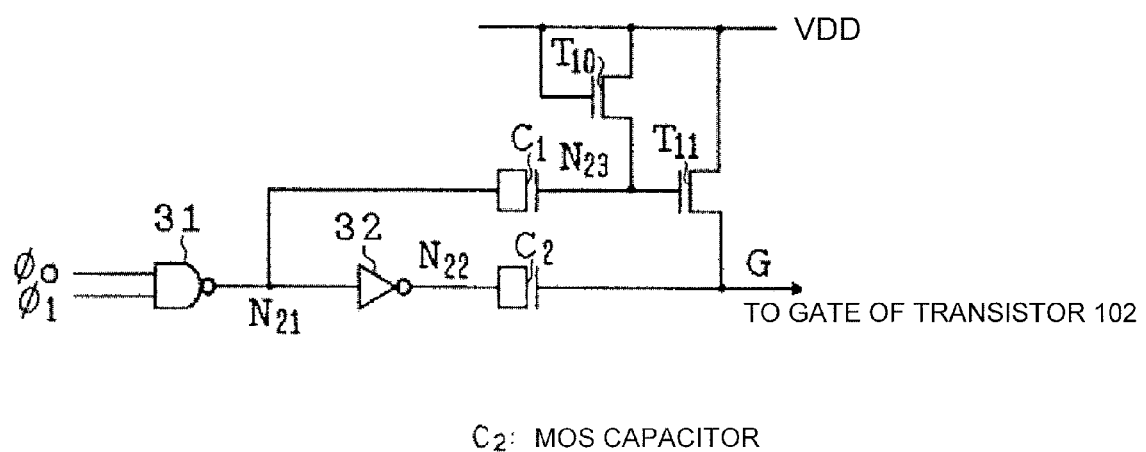
FIG. 22 is a block diagram of a conventional voltage generation circuit for driving a word line.

Based on the word line driving circuit of FIG. 20, in the period t2 of FIG. 21, to increase the potential at the gate (node N6) of the transistor 112 to exceed VDD, a bootstrap effect is produced. Thus, in the period t1, the node N6 is only charged up to a voltage less than VDD (the potential at the node N3) by Vth (threshold voltage of the transistor 114). This is because since the transistor 114 is brought into a conductive state when the gate potential is VDD and the drain (node N3) potential is VDD, the source (node N6) potential does not exceed the voltage VDD−Vth (threshold voltage). Since the configuration of this circuit is equivalent to that of the conventional bootstrap circuit of Patent Document 1, the condition to produce a bootstrap effect (VDD−VSS>2Vth) is not improved.

Further, another characteristics of the word line driving circuit according to example 5 is that, since the transistor 11 is connected to the DC voltage VPP for driving a word line as illustrated in FIG. 16, a word line driving signal having a large amplitude is generated only by the signal S having a small amplitude. This is because a bootstrap effect of the transistor 11 is started immediately after the period t2 in which the signal S is inverted t2 is started.

On the other hand, in FIG. 20, the clock signal that changes between the high level VPP and the low level VSS is inputted to the node N4. Thus, while the potential at the node N2 is charged to VDD and transfer to a floating state is carried out in the period t2, a bootstrap effect of the transistor 111 is not produced until the period t3 when the potential at the node N4 is inverted. Namely, a word line driving signal is generated based on the following three steps: (1) inversion of the signal S; (2) delay by the delay circuit 116; and (3) inversion of the clock signal. This circuit is advantageous in that the word line driving signal can be synchronized with the clock signal, irrespective of the signal S affected by a delay of a logic circuit that selects a pulse output or a delay variation of the delay circuit 116. However, the circuit requires a plurality of input signals, such as the signal S and the clock signal.

Further, the word line driving voltage VPP is generally higher than VDD. Namely, the clock signal has a larger amplitude than that of the signal S that changes between the high level VDD and the low level VSS. Namely, by using another level shift circuit, an amplitude of the clock signal needs to be increased. In contrast, the word line driving circuit according to example 5 uses the high DC voltage VPP to drive a word line and only receives the signal S that changes between the high level VDD and the low level VSS as an input signal. Thus, without using an additional level shift circuit, a word line driving signal having a large amplitude can be generated from an input signal having a small amplitude.

The present invention is applicable to a semiconductor device using a bootstrap circuit. For example, the present invention is applicable to a mobile terminal and a mobile phone incorporating an active-matrix display device, a fingerprint reader incorporating an optical two-dimensional sensor device, a semiconductor memory device including an address decoding function, and the like.

In addition, the entire disclosure of each of the above Patent Documents and the like is incorporated herein by reference thereto. Modifications and adjustments of the exemplary embodiments and examples are possible within the scope of the overall disclosure (including claims) of the present invention and based on the basic technical concept of the invention. Various combinations and selections of various disclosed elements are possible within the scope of the claims of the present invention. That is, the present invention of course includes various variations and modifications that could be made by those skilled in the art according to the overall disclosure including the claims and the technical concept.

What is claimed is:

1. A bootstrap circuit comprising:
a first transistor connecting a first power supply with an output terminal; and
a second transistor applying a first input signal to a gate node of the first transistor and having a conductivity type identical to that of the first transistor,
wherein a second input signal obtained by inverting a level of the first input signal, delaying the inverted signal, and adding a direct current bias to the delayed signal is inputted to a gate node of the second transistor.

2. The bootstrap circuit according to claim 1, further comprising:
a signal delay circuit; and
a direct current bias circuit,
wherein the signal delay circuit and the direct current bias circuit are connected in series to the gate node of the second transistor and arranged for a level-inverted signal of the first input signal.

3. The bootstrap circuit according to claim 1, wherein, the signal delay circuit is connected to the gate node of the second transistor, and the direct current bias circuit is connected to a source or drain node of the second transistor.

4. The bootstrap circuit according to claim 1, further comprising a third transistor connecting a second power supply with the output terminal and having a conductivity type identical to that of the first transistor, wherein a level-inverted signal of the first input signal is applied to a gate node of the third transistor.

5. The bootstrap circuit according to claim 2, further comprising a fourth transistor connecting the second power supply with an output node of the signal delay circuit and having a conductivity type identical to that of the first transistor, wherein a gate node of the fourth transistor is connected to the gate node of the first transistor.

6. The bootstrap circuit according to claim 2, wherein the direct current bias circuit adds a direct current bias voltage that is at least equal to or more than a threshold voltage of the second transistor.

7. The bootstrap circuit according to claim 2, wherein the direct current bias circuit comprises a capacitive element connecting input and output nodes of the direct current bias circuit and a switch element connecting the output node thereof and a bias voltage supply.

8. The bootstrap circuit according to claim 2,
wherein the direct current bias circuit comprises:
a first capacitive element connecting input and output nodes of the direct current bias circuit;
a second capacitive element having one end thereof supplied with an inverted signal of a signal inputted to the input node;
a first switch element connecting the output node with a bias voltage supply; and
a second switch element connecting the other end of the second capacitive element with the bias voltage supply, and
wherein a gate node of the first switch element and the other end of the second capacitive element are connected to each other, and a gate node of the second switch element and the output node are connected to each other.

9. The bootstrap circuit according to claim 2, wherein the signal delay circuit comprises a plurality of inverting circuits connected in series.

10. The bootstrap circuit according to claim 2, wherein the signal delay circuit comprises: a series resistor connecting input and output nodes of the signal delay circuit; and a capacitive element having one end connected to the output node thereof and the other end supplied with a fixed potential.

11. The bootstrap circuit according to claim 10, wherein the series resistor comprises a transistor having one end as a source node and the other end as a drain node.

12. The bootstrap circuit according to claim 10, the capacitive element comprises a transistor having one end as source and drain nodes and the other end as a gate node.

13. A level shift circuit comprising the bootstrap circuit according to claim 1 as an output circuit.

14. A word line driving circuit comprising the bootstrap circuit according to claim 1 as an output circuit.

* * * * *